United States Patent [19]

Philippe

[11] Patent Number: 5,469,117
[45] Date of Patent: Nov. 21, 1995

[54] VOLTAGE-CONTROLLED FREQUENCY OSCILLATOR

[75] Inventor: Pascal Philippe, Caen, France

[73] Assignee: U.S. Philips Corporation, New York, N.Y.

[21] Appl. No.: 223,471

[22] Filed: Apr. 5, 1994

[30] Foreign Application Priority Data

Apr. 14, 1993 [FR] France ................ 93 04380

[51] Int. Cl.⁶ ........................................... H03B 5/00
[52] U.S. Cl. .............. 331/109; 331/117 R; 331/177 V; 331/177 R; 331/167; 331/175; 334/15; 455/255; 455/262; 455/195.1; 455/196.1; 455/191.2
[58] Field of Search ............ 331/117 R, 177 V, 331/177 R, 167, 175, 109; 334/15; 455/255, 262, 266, 195.1, 196.1, 191.2

[56] References Cited

U.S. PATENT DOCUMENTS

| | | | |
|---|---|---|---|
| 3,813,615 | 5/1974 | Okazaki | 331/109 |
| 3,825,858 | 7/1974 | Amemiya | 331/117 R X |
| 4,074,209 | 2/1978 | Lysobey | 331/117 R X |
| 4,536,724 | 8/1985 | Hasegawa et al. | 331/177 V |
| 4,593,257 | 6/1986 | Wignot | 331/117 R |
| 4,736,169 | 4/1988 | Weaver et al. | 331/117 R |

FOREIGN PATENT DOCUMENTS 0270298  6/1988  European Pat. Off. .......... H03B 5/12

*Primary Examiner*—Robert J. Pascal
*Assistant Examiner*—Arnold Kinkead
*Attorney, Agent, or Firm*—Laurie E. Gathman

[57] ABSTRACT

An oscillator comprising an amplifier device, a capacitive divider bridge whose terminals are connected between a control electrode of the device and a reference voltage, the intermediate junction point of this bridge being connected to a principal electrode of the device, and also comprising, in parallel between the control electrode and the reference voltage, a tuning circuit having parallel branches: a first branch with an inductance in series with a variable capacitance, and, a second branch equivalent to a variable capacitance. The tuning circuit has a third branch constituted by a capacitance in parallel with the first branch, while a series inductance whose value is smaller than that of the tuning inductance is arranged between the junction point connecting the two latter branches and the junction point connecting the control electrode of the device to the second branch and to the divider bridge.

8 Claims, 1 Drawing Sheet

5,469,117

VOLTAGE-CONTROLLED FREQUENCY OSCILLATOR

BACKGROUND OF THE INVENTION

1. Field of the Invention

The invention relates to a voltage-controlled frequency oscillator comprising an amplifier device which has a main current path defined between a first and a second electrode, and a control electrode for controlling the conduction of this device, and comprising a capacitive divider bridge effecting a feedback coupling between the first electrode of the device and its control electrode, while one terminal of the divider bridge is connected to the control electrode and the other terminal is connected to a reference voltage and the intermediate junction point connected to the first electrode, said oscillator being also connected to a tuning circuit arranged between the control electrode and the reference voltage, which circuit comprises a first parallel branch constituted by a tuning inductance in series with a first variable capacitance and a second parallel branch equivalent to a second variable capacitance.

2. Description of the Prior Art

Such an oscillator of the Colpitts type is known from the document EP-A-0 270 298. It is particularly used as a local oscillator for receiving television signals.

A constant technical problem in this field is the tendency to cover a frequency range which is as extensive as possible when it is based on a given tuning inductance, while maintaining reliable oscillation conditions for the amplifier device. As the reactive impedance values are susceptible to variation in high proportions between the lowest frequency and the highest frequency in the envisaged frequency range, it is often necessary to use a tuning circuit having a relatively complex arrangement and realizing a satisfactory compromise between safe operation of the oscillator and the extent of the frequency range covered.

The known oscillator recommends the use of a tuning circuit having said second parallel branch so as to widen the frequency range covered by the capacitance variation of the variable capacitance diodes which constitute said variable capacitances. As far as the basic technical aspects of operation of such an oscillator are concerned, reference is made to the cited document EP-A-0 270 298. The difficulties of obtaining both an extensive range of frequencies and stability of operation of the oscillator throughout the extent of this range are explained in detail in this document whose contents are herein incorporated by reference. It has been stated that the known oscillator is capable of covering various frequency ranges, the most extensive having 263 and 509 MHz as their extreme values, i.e. a ratio of 1.93 between these frequencies. It is desirable to extend these possibilities and to achieve a ratio of at least 2.7 between the extreme frequencies in the same range.

SUMMARY OF THE INVENTION

The invention thus has for its object to provide an oscillator having a very extensive range of frequencies while ensuring reliable oscillation conditions for the amplifier device throughout the extent of the frequency range.

According to the invention, an oscillator of the type described in the opening paragraph is therefore characterized in that the tuning circuit comprises a third parallel branch constituted by a fixed capacitance, and in that the assembly of first and third parallel branches is connected to the junction point between the control electrode of the device and the second parallel branch via a series inductance whose value is smaller than that of the tuning inductance.

The assembly of the first and third parallel branches thus constitutes a resonant circuit which may be qualified as a combination of a series mode and a parallel mode.

In the absence of the series inductance provided in accordance with the invention, there will be a too narrow compromise between the width of the frequency band covered and the stability of oscillation at the limit frequencies of the band. Indeed, if it is attempted to widen the frequency band, the impedance of the tuning circuit will decrease. As this impedance is very low, the oscillation will cease because the tuning circuit dissipates more energy than the amplifier device can provide.

As will be described in greater detail hereinafter, the insertion of the series inductance introduces a possibility of resonance at a frequency which is different than the frequency which is determined by the tuning inductance and the series-parallel combination of the capacitances provided in the tuning circuit. For this reason the value of the series inductance is chosen as a fraction of the value of the tuning inductance only so that the afore-mentioned undesirable frequency is substantially higher than the frequency which results from the tuning inductance. It may be rendered so high that this parasitic oscillation is actually not produced.

In a preferred embodiment of the invention the oscillator is characterized in that the second parallel branch is constituted by a fixed capacitance arranged in series with a variable capacitance diode of the same model as the variable capacitance diode constituting said first variable capacitance.

For a suitable choice of the values of the fixed capacitance comprised in the second parallel branch and the fixed capacitance constituting the third parallel branch, it is thus possible to use two variable capacitance diodes of the same model which are advantageously controlled by the same variable tuning voltage.

Consequently, the practical realization of the oscillator can be simplified in a corresponding manner.

BRIEF DESCRIPTION OF THE DRAWING

These and other aspects of the invention will be apparent from and elucidated with reference to the embodiments described hereinafter.

In the drawings

DETAILED DESCRIPTION OF THE PREFERRED EMBODIMENT

Figure 1:
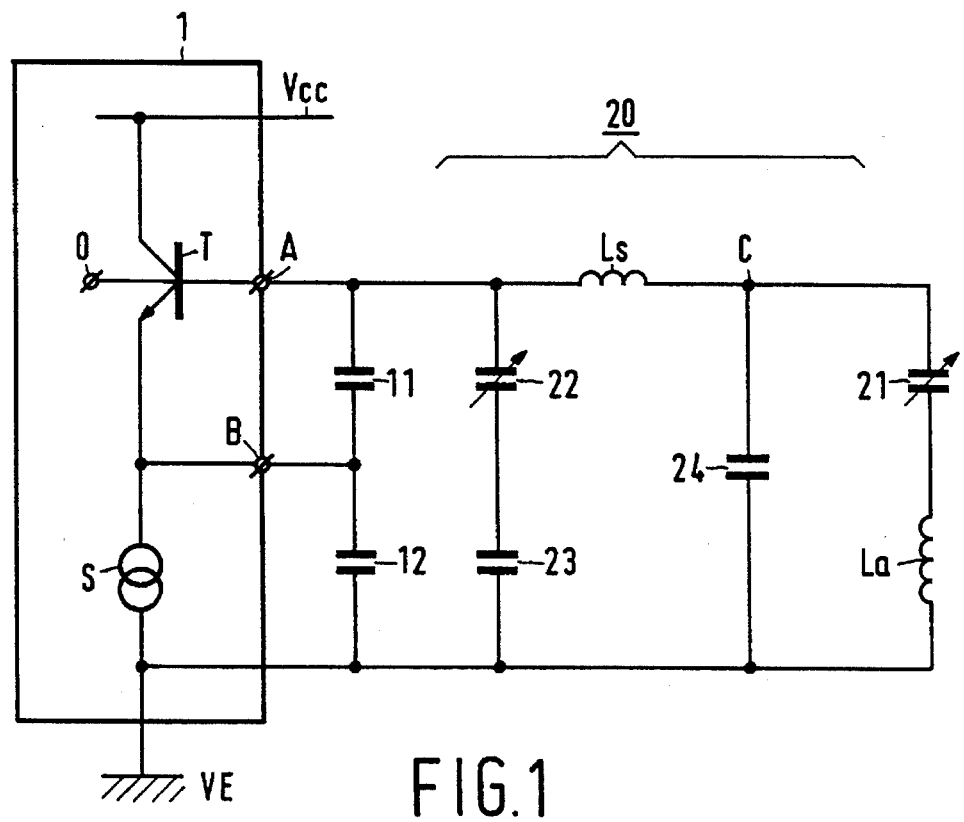
FIG. 1 shows a circuit digram of the oscillator according to the invention.

The oscillator shown very diagrammatically in FIG. 1 comprises a negative resistance circuit section 1 in which a transistor T constitutes an amplifier device whose main current path is fed between a supply voltage Vcc and a reference voltage VE. A terminal A is connected to the base of transistor T and a terminal B is connected to the emitter of this transistor. The emitter of the transistor T is connected to the reference voltage VE via a current source S. The circuit section 1 only shows the transistor T and the current source S, while other components (not shown) may also be incorporated in the form of a monolithic integrated circuit, but which do not directly relate to the invention. The oscillation signal generated by the transistor T may be taken from the base of this transistor, which is symbolically shown in the Figure by way of the output terminal O.

A capacitive divider bridge realizes a feedback coupling between the emitter of the transistor T and the base of this transistor, which divider bridge is constituted by series-arranged capacitors 11 and 12, while the free terminal of the capacitor 11 is connected to the terminal A (base of the transistor T) and the free terminal of the capacitor 12 is connected to the reference voltage VE. The common point between the capacitors 11 and 12 is connected to the terminal B (emitter of the transistor T).

A tuning circuit 20 is arranged between the terminal A and the reference voltage VE, which circuit is constituted by a first parallel branch formed by a tuning inductance La in series with a variable capacitance 21 and a second parallel branch constituted by a second variable capacitance 22 in series with a fixed capacitance 23, which branch is equivalent to a variable capacitance.

A third branch, arranged in parallel with the first branch 21, La, is constituted by a fixed capacitor 24. Opposite the reference voltage VE, the first (21, La) and third (24) parallel branches are joined at a junction point C. At the side opposite the reference voltage VE, the divider bridge 11, 12 and the second parallel branch 22, 23 are directly connected to the terminal A. In accordance with an essential feature of the invention, the junction point C is connected to the terminal A via a series inductance Ls which has a lower value than the tuning inductance La. As will be described in greater detail hereinafter, the series inductance Ls provides an efficient means for ensuring that the oscillation conditions are verified at the highest frequencies when the range of frequencies at which the oscillator can be tuned is extended. The presence of the series inductance Ls implies that the tuning circuit 20 is capable of resonating at two frequencies one principal frequency which is mainly determined by the tuning inductance La and the other parasitic frequency which is determined by the series inductance Ls.

As a value, which is lower with regard to the inductance La, has been chosen for the latter inductance, there is such a high frequency that the tuning inductance La has a considerable reactance with regard to the reactance of the capacitor 24 so that the influence of the capacitor 24 at the junction point C is preponderant.

At the other terminal of the inductance Ls, i.e. at the junction point A, the reactance with respect to the reference voltage VE is confined to a capacitance resulting from the combination of capacitors 11, 12, 23 and the variable capacitance 22.

The parasitic resonance frequency can thus be computed and will mainly be determined by the choice of the value of the capacitances 11, 12, 24 and the inductance Ls.

As a low value with respect to the tuning inductance La has been chosen for the inductance Ls, it will be easy to carry the parasitic resonance frequency substantially beyond the highest frequency of the frequency range in the principal mode so that the oscillation conditions at the parasitic frequency are not realized.

The role and influence of the series inductance Ls will now be examined in a qualitative way.

Let it first be assumed that the series inductance Ls and the second parallel branch comprising capacitances 22 and 23 are omitted and that the junction point C is directly connected to the terminal A in parallel with the capacitive divider bridge 11, 12. In this case the capacitance 24 which is arranged in parallel with the divider bridge 11, 12 serves for increasing the equivalent capacitance in parallel with the first branch 21, La. To extend the frequency range towards the lowest possible frequencies, there is a reason for choosing a parallel capacitance 24 of the highest possible value.

However, in this case the oscillation conditions are no longer satisfied at the high end of the frequency range because the impedance seen by the amplifier device T is then insufficient. For obtaining a suitable impedance ensuring an oscillation in the higher frequency section it is advisable to choose a smaller parallel capacitance 24. A compromise ensuring a wide frequency range is thus not possible. Let it now be assumed that the parallel capacitance 24 is omitted and replaced by said second parallel branch constituted by the variable capacitance 22 and the fixed capacitance 23. This arrangement corresponds to the oscillator known from the document EP-A-0 270 298 mentioned above. With regard to the previously envisaged case, the conditions are more favorable because the parallel capacitance which is equivalent to the series-arranged capacitances 22 and 23 may become low because of the variable capacitance 22 when a position is taken up at the high end of the frequency range whereas it increases at the other end of the range for the lowest frequencies.

A wider frequency range is also obtained at high frequencies, which is, however, less important because the variable capacitance 22, though having a low value, is situated in parallel with the divider bridge 11, 12 which thus has a predominant influence. A significant increase of the tuning range would need an increase of the equivalent parallel capacitance at the low end of the frequency range. It is nevertheless important that the parallel capacitance has a high quality coefficient so that it does not substantially reduce the impedance of the tuning circuit at the lowest frequencies, which would render the oscillator operation critical at these frequencies. For this reason the increase of the equivalent parallel capacitance obtained by the simple increase of the value of the capacitance 23 is not a satisfactory solution. A higher quality coefficient is obtained if the equivalent parallel capacitance is increased by means of a supplementary capacitance of a fixed value, which capacitance is added in parallel with the variable capacitance branch. The result is a certain diminution of the impedance at high frequencies with respect to the previous situation which is compensated in the present invention by the addition of the series inductance Ls.

According to the invention, an extensive frequency range is obtained by using two capacitive branches 24 and 22, 23 in parallel with the first tuning branch La, 21 and by arranging the series inductance Ls between the junction point A and the junction point C. In this way the impedance level of the tuning circuit can be adapted in a quasi-optimal fashion to that required for obtaining a satisfactory operation of the oscillator in the searched frequency range. At the highest frequencies the choice of a capacitance 24 of relatively low value contributes to increasing the impedance level of the tuning circuit. The operation of the oscillator at these frequencies is also made easier by the presence of the inductance Ls. Detailed computations show that this inductance results in a higher impedance of the tuning circuit while having little effect on the oscillation frequency. These advantageous effects combined may be obtained with the values of the capacitance 24 and the inductance Ls so that any risk of oscillation in the parasitic mode is normally excluded. If for whatever reason the risk of parasitic oscillation subsists, it will be possible to definitively eliminate this risk by adding a small resistance in series with the inductance Ls without notably perturbing the operation in the envisaged mode.

At the lowest frequencies in the searched frequency range the impedance of the series inductance Ls may be substantially negligible so that the capacitances of the divider bridge 11, 12 and of the second capacitive branch 22, 23 are added in parallel with the capacitance 24. By using the variable capacitances 21 and 22 varying between 2.5 pF and 40 pF, it appears to be possible in practice to cover a range having an extreme frequency ratio which is higher than factor 2.8 for a tuning inductance La of the given value. By preserving the same elements and by adding a second tuning inductance of a higher value in series with the tuning inductance La, it is also possible to cover a range of lower frequencies whose ratio of extreme frequencies is also equal to 2.8, while the oscillator thus realized is stable throughout these two frequency ranges.

Figure 2:
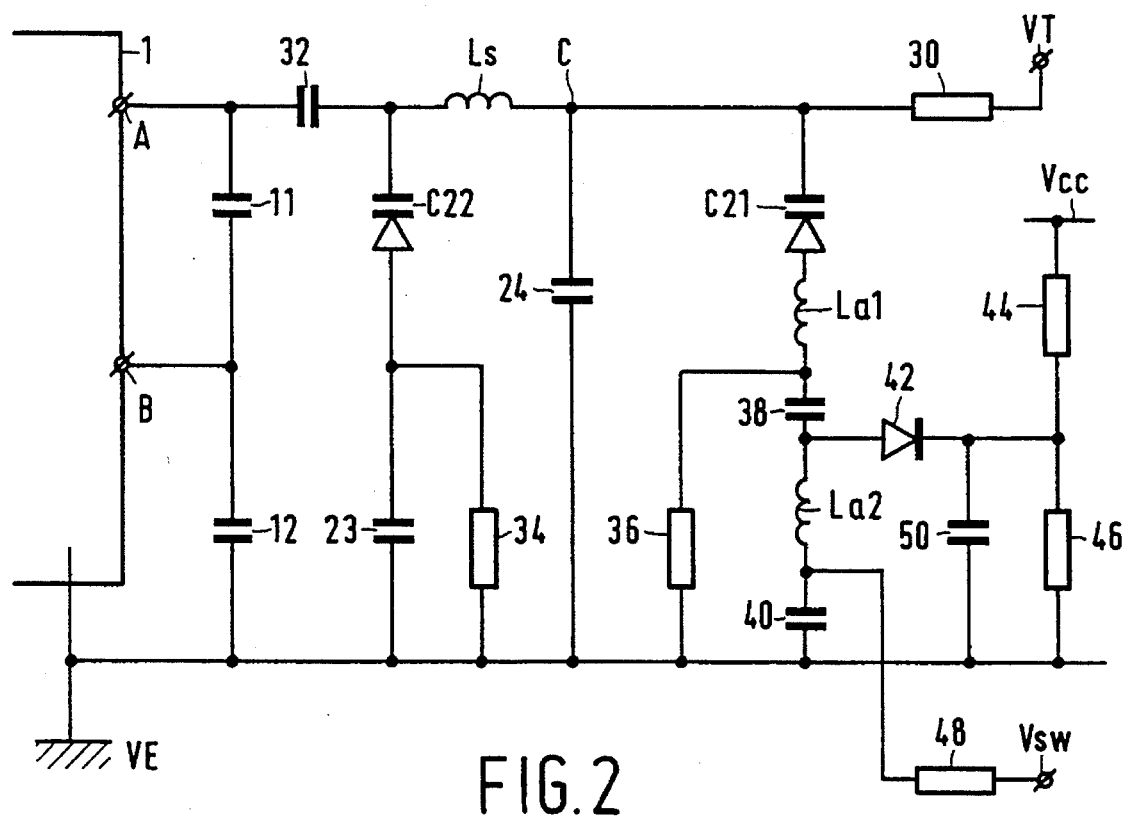
FIG. 2 shows the electrical circuit diagram of an embodiment of this oscillator.

The oscillator shown in FIG. 2 is a practical embodiment of the invention. In FIG. 2 the elements corresponding to those in FIG. 1 and having the same function are denoted by the same reference symbols.

In this Figure, the variable capacitances 22 and 21 of FIG. 1 are realized by means of variable capacitance diodes C22 and C21, respectively, of the same model, both of which are controlled by the same tuning voltage VT which is applied to the junction point C via a blocking resistance 30 of high value. The DC separation between the junction point C and the terminal A is ensured by means of a coupling capacitor 32 of a high value chosen for the purpose of a low reactance throughout the range of frequencies.

The anode of the diode C22 is connected to the DC potential of the reference voltage VE (ground) by means of a blocking resistor 34, while a similar arrangement applies to the diode C21 whose anode is connected via the tuning inductance La1 to the DC potential of the reference voltage VE via a blocking resistor 36. To the radio frequency point of view, a supplementary inductance La2 whose value is higher than that of the inductance La1 is arranged between the inductance La1 and the reference voltage VE, while the sum of these inductances is used for covering the lowest range of the frequencies searched.

Viewed from the DC voltage end, a separation is realized at both sides of the supplementary inductance La2 by the capacitances 38 and 40 of high value so that the impedance of these capacitances is negligible at the frequencies used.

A band switching circuit is realized by means of a switching diode 42 whose anode is connected between the capacitance 38 and the inductance La2 and whose cathode is connected to a potential halfway between the supply voltage Vcc and the reference voltage VE by means of a resistive bridge 44, 46. The anode of the switching diode 42 may be connected either to a voltage equal to the supply voltage Vcc so as to render this diode conducting, or to a voltage equal to the reference voltage VE so as to block this diode, which is effected by a switching signal Vsw applied to the junction point of the capacitance 40 and the supplementary inductance La2 via an isolating resistance 48. When the diode 42 conducts, it transmits the RF signal at the reference voltage VE via a capacitance 50 having such a high value that its impedance is negligible in the RF mode.

Beside the accessory elements used for switching the frequency range, the diagram of FIG. 2 corresponds to that of FIG. 1 in which the tuning inductance La may assume two distinct values. In practice, the oscillator shown in FIG. 2 can cover the VHF television frequency band of 87 to 204 MHz as well as the VHF band of 188 to 513 MHz in a construction in which the elements have the following values:

| reference symbols | values |
| --- | --- |
| capacitances | |
| 11, 12 | 15 pF |
| 23 | 47 pF |
| 24 | 8 pF |
| C21, C22 | 2.5 to 40 pF |
| 32 | 100 pF |
| 38, 40, 50 | 1 nF |
| inductances | |
| La1 | 35 nH |
| La2 | 160 nH |
| Ls | 7 nH |
| resistors | |
| 30, 34, 36 | 27k Ohms |
| 48 | 390 Ohms |
| 44 | 1k Ohm |
| 46 | 680 Ohms |
| voltages | |
| Vcc | 5 V |
| VE | 0 V |
| Vsw | 0 or 5 V |
| VT | 0.5 to 28 V. |

Other frequency ranges than those given in the example may of course also be obtained by means of the invention.

The values of the elements for coveting a given range of frequencies result from simple computations by those skilled in the art.

The invention is not limited to the use of a bipolar transistor in so far as the amplifier device T as described in the embodiments is concerned, but can also be applied for another device, notably a field effect transistor, since a feedback coupling may be realized between its control electrode (gate) and its first electrode (source), the main current path thus being defined between source and drain.

I claim:

1. A voltage-controlled frequency oscillator comprising:

an amplifier device having a first and a second electrode for defining a main current path, and a control electrode for controlling the conduction of current in the main current path;

a capacitive divider bridge for providing a feedback coupling between the first electrode and the control electrode of the amplifier device, the capacitive divider having a first end coupled to the control electrode, and a second end coupled to a reference voltage, and an intermediate junction point connected to the first electrode; and a tuning circuit coupled between the control electrode and the reference voltage and including (i) a first parallel branch including a tuning inductance in series with a first variable capacitance, (ii) a second parallel branch, coupled to the first parallel branch, coupled to the control electrode of the amplifier device and having a second variable capacitance, (iii) a third parallel branch coupled to the second parallel branch and including a fixed capacitance, and (iv) a series inductance having a first end coupled to the first and third parallel branches and a second end coupled to the control electrode of the amplifier device, the series inductance having an inductance value which is less than an inductance value of the tuning inductance.

2. An oscillator as claimed in claim 1, wherein the second parallel branch includes a fixed capacitance in series with the second variable capacitance and wherein the second variable capacitance is a variable capacitance diode.

3. An oscillator as claimed in claim 2, wherein the first variable capacitance is also a variable capacitance diode.

4. An oscillator as claimed in claim 3, wherein the variable capacitance diodes are controlled by a tuning voltage.

5. An oscillator as claimed in claim 1, wherein the amplifier device is a bipolar transistor having a base, an emitter, and a collector and wherein the base corresponds to the control electrode, the emitter corresponds to the first electrode and the collector corresponds to the second electrode.

6. A voltage controlled frequency oscillator, comprising:
   an amplifier device;
   a series transmitting inductance;
   a resonant circuit coupled to the series transmitting inductance and including a first tuning inductance;
   a capacitive divider assembly coupled to the amplifier; and
   a capacitive branch coupled to the resonant circuit and coupled in parallel with (i) the capacitive divider assembly via the series transmitting inductance and (ii) the resonant circuit,
   wherein the series transmitting inductance is chosen such that the series transmitting inductance has an inductance value which is less than an inductance value of the first tuning inductance.

7. The oscillator in accordance with claim 6, wherein the resonant circuit further includes a second tuning inductance in series with the first tuning inductance and having a value which is greater than the value of the first tuning inductance.

8. A voltage-controlled frequency oscillator comprising:
   an amplifier device having a first and a second electrode for defining a main current path, and a control electrode for controlling the conduction of current in the main current path;
   a capacitive divider bridge for providing a feedback coupling between the first electrode and the control electrode of the amplifier device, the capacitive divider having a first end coupled to the control electrode, a second end coupled to a reference voltage, and an intermediate junction point connected to the first electrode; and
   a tuning circuit coupled between the control electrode and the reference voltage and including (i) a first parallel branch including a tuning inductance in series with a first variable capacitance, (ii) a second parallel branch, coupled to the first parallel branch, coupled to the control electrode of the amplifier device and having a second variable capacitance, (iii) a third parallel branch coupled to the second parallel branch and including a fixed capacitance, and (iv) a series inductance for coupling the second and third parallel branches together, the series inductance having a value which is less than the value of the tuning inductance.

* * * * *